(12) United States Patent
Lin et al.

(10) Patent No.: US 12,710,455 B2
(45) Date of Patent: Aug. 18, 2026

(54) PROCESS-VOLTAGE SENSOR WITH SMALLER CHIP AREA

(71) Applicant: MEDIATEK INC., Hsin-Chu (TW)

(72) Inventors: Yi-Ta Lin, Hsinchu City (TW); Hung-Chieh Tsai, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 156 days.

(21) Appl. No.: 18/663,101

(22) Filed: May 14, 2024

(65) Prior Publication Data

US 2024/0410920 A1 Dec. 12, 2024

Related U.S. Application Data

(60) Provisional application No. 63/472,588, filed on Jun. 12, 2023.

(51) Int. Cl.
*G01R 19/00* (2006.01)
*G01R 35/00* (2006.01)

(52) U.S. Cl.
CPC ....... *G01R 19/0084* (2013.01); *G01R 35/005* (2013.01)

(58) Field of Classification Search
CPC .......................... G01R 19/0084; G01R 35/005
See application file for complete search history.

(56) References Cited

U.S. PATENT DOCUMENTS 5,914,633 A * 6/1999 Comino ............. H03H 11/1291 327/552
6,243,034 B1 * 6/2001 Regier .................. H03M 1/145 341/166
6,417,727 B1 * 7/2002 Davis ..................... H03H 11/04 327/554
6,677,814 B2 * 1/2004 Low ................... H03H 21/0001 327/554
6,842,710 B1 * 1/2005 Gehring ............. G01R 31/2884 327/344
2006/0214725 A1 * 9/2006 Rotchford ................ H03H 1/02 327/551

OTHER PUBLICATIONS

Understanding Integrating ADCs, Maxim Integrated, 2002, available at https://www.analog.com/en/resources/technical-articles/adc-architectures.html. (Year: 2002).*

(Continued)

*Primary Examiner* — Daniel R Miller
(74) *Attorney, Agent, or Firm* — Winston Hsu

(57) ABSTRACT

The present invention provides a PV sensor including a control circuit, a RC calibration circuit, and a voltage sensor. The control circuit is configured to generate at least one control signal. The RC calibration circuit is configured to receive the at least one control signal to generate a voltage indicates information of (1/R*C). The voltage sensor comprises a comparator, wherein the voltage sensor senses a voltage level of a received signal by using comparator to generate a sensing result, and the comparator is further configured to compare the calibration result within a reference voltage to generate a comparison result to the control circuit.

8 Claims, 4 Drawing Sheets

(56) References Cited

OTHER PUBLICATIONS

Juergen Carstens, Precise Time-Constant Measurement Circuit To Detect RC Process-Induced Variations On-Chip, IP.com No. IPCOM000138810D, 2006 (Year: 2006).*
Chung ,"An All-Digital Voltage Sensor for Static Voltage Drop Measurements", IEEE Instrumentation and Measurement Society, 2016.
Chang ,"Near-/Sub-Vth Process, Voltage, and Temperature (PVT) Sensors with Dynamic Voltage Selection", IEEE, 2013.
Chen ,"Fully On-Chip Temperature, Process, and Voltage Sensors", IEEE, 2010.

* cited by examiner

PROCESS-VOLTAGE SENSOR WITH SMALLER CHIP AREA

CROSS REFERENCE TO RELATED APPLICATIONS

This application claims the benefit of U.S. Provisional Application No. 63/472,588, filed on Jun. 12, 2023. The content of the application is incorporated herein by reference.

BACKGROUND

The performance of semiconductor devices may vary dependent upon the conditions under which the device is used. For example, performance characteristics, such as rising time, falling time, gain, bandwidth, linearity, frequency response, etc. of a semiconductor device may vary dependent upon a power supply voltage level and the temperature of the device. To stabilize the performance characteristics of the device, a process, voltage and temperature (PVT) sensor or a PV sensor is always placed in the chip, which is a crucial roles in a calibration loop such as adaptive compensation loop, so that the device performs as well as it does at normal PVT conditions.

As the chip area becomes larger, engineers will install many PV sensors in various regions of the chip. Therefore, how to effectively reduce the area of PV sensors and keep relative accuracy is an important issue.

SUMMARY

It is therefore an objective of the present invention to provide a PV sensor, which combine a resistor-capacitor (RC) calibration circuit and a voltage sensor to achieve the purpose of hardware reuse, to lower the chip area of the PV sensor.

According to one embodiment of the present invention, a PV sensor comprising a control circuit, a RC calibration circuit and a voltage sensor is disclosed. The control circuit is configured to generate at least one control signal. The RC calibration circuit is configured to receive the at least one control signal to generate a calibration result indicates information of (1/R*C). The voltage sensor comprises a comparator, wherein the voltage sensor senses a voltage level of a received signal by using comparator to generate a sensing result, and the comparator is further configured to compare the calibration result within a reference voltage to generate a comparison result to the control circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
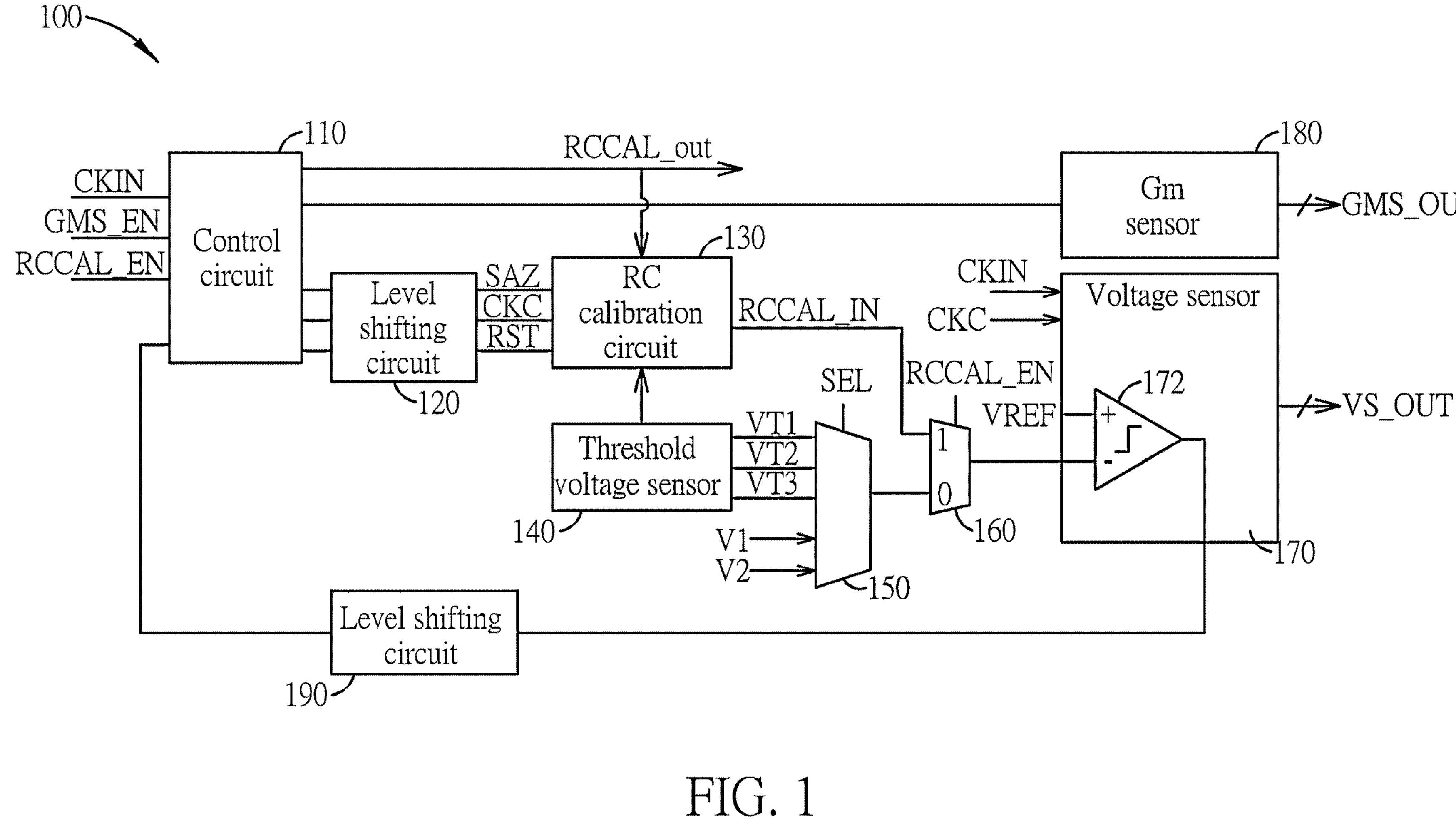
FIG. 1 is a diagram illustrating a PV sensor according to one embodiment of the present invention.

FIG. 1 is a diagram illustrating a process-voltage (PV) sensor 100 according to one embodiment of the present invention. As shown in FIG. 1, the PV sensor 100 comprises a control circuit 110, a level shifting circuit 120, a resistor-capacitor (RC) calibration circuit 130, a threshold voltage sensor 140, a multiplexer 150, a multiplexer 160, a voltage sensor 170, a transconductance (Gm) sensor 180 and a level shifting circuit 190.

The control circuit 110 is configured to generate control signals to control the Gm sensor 180 and the RC calibration circuit 130 to generate the corresponding outputs. In detail, the control circuit 110 receives an input clock signal CKIN, a Gm-sensor enable signal GMS_EN and an RC-calibration enable signal RCCAL_EN, wherein the control circuit 110 generates a control signal to trigger the Gm sensor 180 to generate an output signal GMS_OUT if the Gm-sensor enable signal GMS_EN has an enablement indication (e.g., voltage high level), and the control circuit 110 generates control signals RST, CKC and SAZ to the RC calibration circuit 130 via the level shifting circuit 120 if the RC-calibration enable signal RCCAL_EN has an enablement indication (e.g., voltage high level).

It is noted that the operation of the Gm sensor 180 is known by a person skilled in the art, for example, the Gm sensor 180 may comprise multiple delay ratio estimator or ring oscillators for getting the process information of the inverters, and the present invention focuses on the hardware reuse of the voltage sensor 170, so the detailed description of the Gm sensor 180 is omitted here.

The level shifting circuit 120 is configured to adjust the voltage level of the control signals RST, CKC and SAZ outputted by the control circuit 110. In another embodiment, the level shifting circuit 120 can be removed from the PV sensor 100 if the RC calibration circuit 130 can correctly process the control signals from the control circuit 110.

The RC calibration circuit 130 is an analog circuit configured to generate a voltage "RCCAL_IN" by the control signals RST, CKC and SAZ, wherein the voltage RCCAL_IN indicates the information of (1/R*C). For example, the RC calibration circuit 130 may comprise a capacitor bank and a voltage-to-current converter (V-to-I converter) comprising a series of resistors and an error amplifier, wherein the voltage-to-current converter receives a reference voltage to generate a current signal, and the current signal is used to charge a top-plate of the capacitor bank to generate the voltage RCCAL_IN. After charging process, the voltage RCCAL_IN is compared to a reference voltage VREF by a comparator 172 of the voltage sensor 170, the comparison result decides the switching polarity in the next state. According to each of the comparison results, the control logic 110 records the comparison result and outputs a calibration code RCCAL_OUT, which represents a set of calibration code for the R&C variation. The calibration code of RCCAL_OUT can be also utilized to compensate the R&C corner variation.

In this embodiment, the control signal RST is used to reset the RC calibration circuit 130, that is, to release the charge the top-plate of the capacitor bank. The control signal SAZ is used to trigger the RC calibration circuit 130 to start to charge the capacitor bank to generate the voltage RCCAL_IN. The control signal CKC is a clock signal for the use of the comparator 172 of the voltage sensor 170.

The multiplexer 160 is configured to output the voltage RCCAL_IN to the comparator 172 of the voltage sensor 170 when the RC-calibration enable signal RCCAL_EN has the enablement indication.

The voltage sensor 170 comprises an analog-to-digital converter (ADC) such as a single-slope ADC (SSADC), and the comparator 172 can be used for the RC calibration when the RC-calibration enable signal RCCAL_EN has the enablement indication. In this embodiment, the comparator 172 receives the voltage RCCAL_IN from the RC calibration circuit 130 via the multiplexer 160 and compares the voltage RCCAL_IN with a reference voltage with the reference voltage VREF with a suitable level to generate a comparison result. It is noted that the positive terminal and the negative terminal of the comparator 172 shown in FIG. 1 are for illustrative, not a limitation of the present invention, that is, the feature that the comparator 172 receives the voltage RCCAL_IN at the negative terminal and receives the reference voltage at the positive terminal is not a limitation of the present invention.

The comparison result is sent back to the control circuit 110 via the level shifting circuit 190. In this embodiment, the comparison result indicates the comparison of the information of (1/R*C) and the reference voltage, so the control circuit 110 can use the comparison result to compensate the resistor-capacitor filters within the chip to stabilize the performance of the resistor-capacitor filters (for example, the filter may have an adjustable capacitor whose capacitance is controlled based on the calibration result of the comparator 172).

The level shifting circuit 190 is configured to adjust the voltage level of the comparison result outputted by the comparator 172. In another embodiment, the level shifting circuit 190 can be removed from the PV sensor 100 if the control circuit 110 can correctly process the comparison result from the comparator 172.

In addition, if the RC-calibration enable signal RCCAL_EN does not have the enablement indication (e.g., low voltage level), the multiplexer 160 outputs another voltage signal to the comparator 172. In the embodiment shown in FIG. 1, the multiplexer 150 may select one of the received signals and output the elected signal to the multiplexer 160 based on a selection signal SEL, wherein the received signals of the multiplexer 150 may comprise multiple sensing results VT1-VT3 generated by the threshold voltage sensor 140 and other voltage signals such as V1 and V2 generated by other signal generators.

In addition, when the RC-calibration enable signal RCCAL_EN does not have the enablement indication, and the multiplexer 160 outputs one of the signals VT1-VT3, V1 and V2 to the comparator 172, the comparator 172 may serve as part of the voltage sensor 170, that is the voltage sensor 170 senses the voltage level of one of the signals VT1-VT3, V1 and V2 to generate a sensing result VS_OUT.

In the above embodiment shown in FIG. 1, the comparator 172 within the voltage sensor 170 can be used for RC calibration and voltage sensing at different times. Therefore, the embodiment can combine the RC calibration circuit 130 and the voltage sensor 170 to achieve the purpose of "hardware reuse", to lower the chip area of the PV sensor 100.

Figure 2:
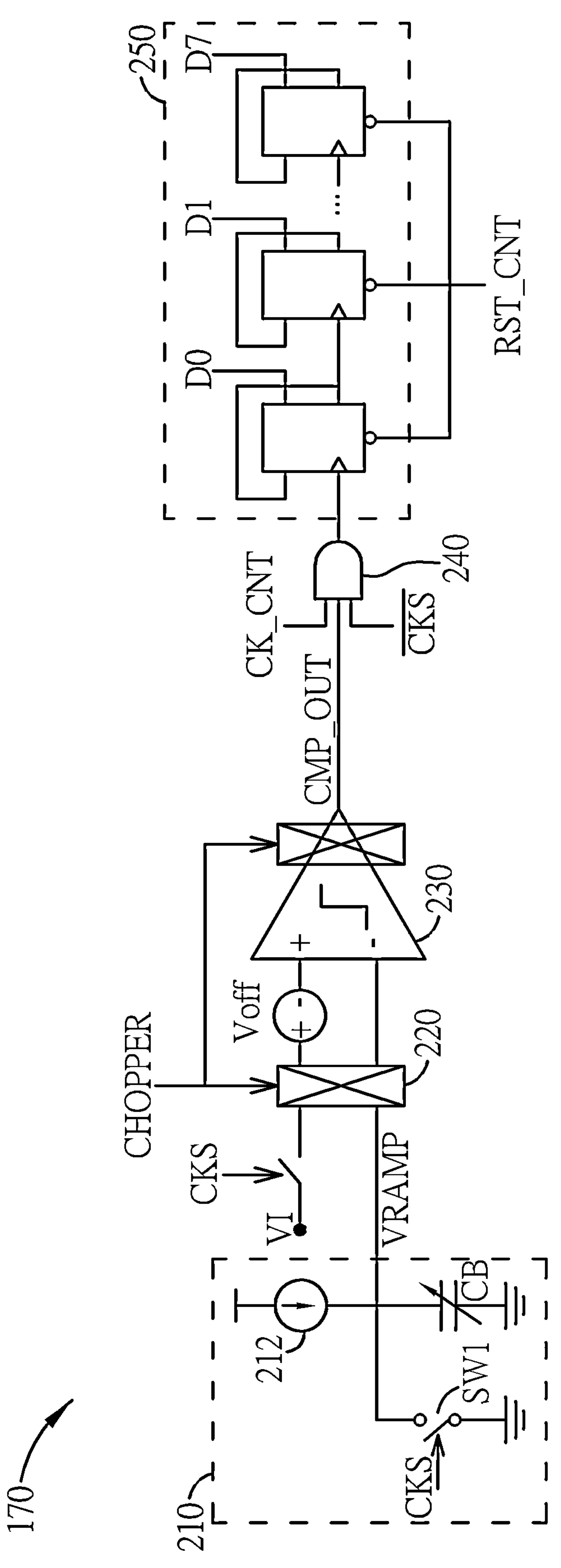
FIG. 2 is a diagram illustrating the voltage sensor according to one embodiment of the present invention.

FIG. 2 is a diagram illustrating the voltage sensor 170 according to one embodiment of the present invention. As shown in FIG. 2, the voltage sensor 170 comprises a ramp signal generator 210, a chop circuit 220, a comparator 230, a logical gate 240 and a counter 250. The ramp signal generator 210 comprises a ramp current generator 212, a switch SW1 and a variable capacitor CB, wherein switch SW1 is controlled by a clock signal CKS, and the ramp current generator 212 is configured to generate a ramp current signal to charge the capacitor CB when the switch SW1 is disabled to generate a ramp signal VRAMP (i.e., voltage signal). The comparator 230 is configured to compare an input signal VI with the ramp signal VRAMP to generate a comparison result CMP_OUT, wherein the chopper circuit 220 is configured to modulate the offset of the ramp current signal generated by the ramp current generator 212 or the comparator 230. The logical gate 240 is implemented by using an AND gate and is configured to receive the comparison result CMP_OUT, an inverted clock signal $\overline{CKS}$ and a counter clock signal CK_CNT to generate a counter control signal, to trigger the flip-flops within the counter 250 to increase/update the counter value.

Figure 3:
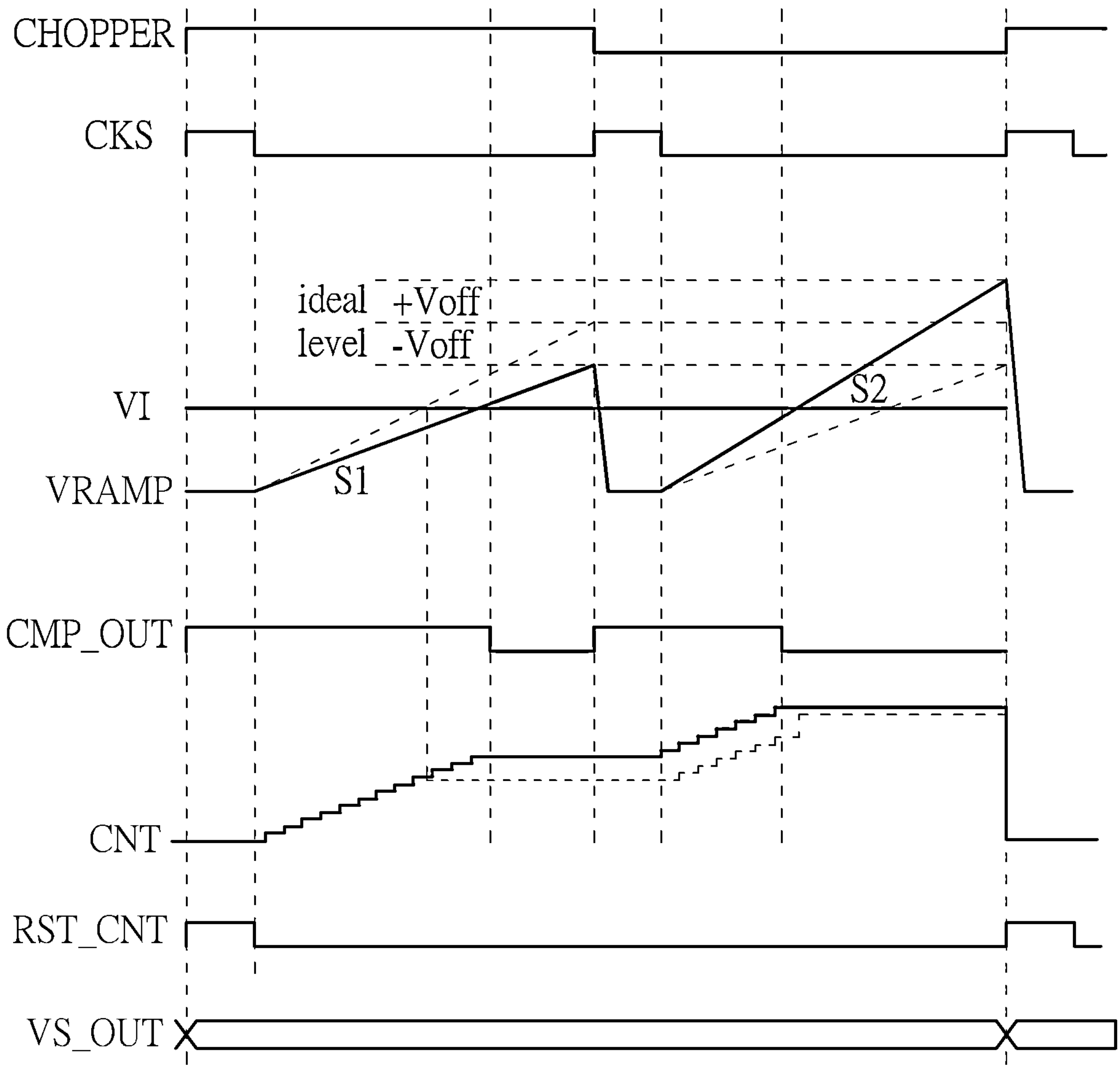
FIG. 3 shows a timing diagram of part of the signals of the voltage sensor according to one embodiment of the present invention.

FIG. 3 shows a timing diagram of part of the signals of the voltage sensor 170 according to one embodiment of the present invention. As shown in FIG. 2, when the chopper signal CHOPPER has a high voltage level, the comparator 230 receives the input signal VI and the ramp signal VRAMP at the positive terminal and negative terminal, respectively, and the counter 250 starts to count until the ramp signal VRAMP is greater than the summation of input signal VI and positive voltage offset "+Voff"; and when the chopper signal CHOPPER has a low voltage level, the comparator 230 receives the input signal VI and the ramp signal VRAMP at the negative terminal and positive terminal, respectively, and the counter 250 starts to count until the ramp signal VRAMP is greater than the summation of input signal VI and a negative voltage offset "−Voff". In addition, every one cycle of the chopper signal CHOPPER, a reset signal RST_CNT is applied to the flip-flops of the counter 250 to reset the counter value CNT. In addition, every one cycle of the chopper signal CHOPPER (i.e., two cycles of the clock signal CKS), the voltage sensor 170 outputs the sensing result VS_OUT comprising D0-D7. In FIG. 3, the dotted line of the ramp signal Vramp shows the ideal case (i.e., without the voltage offset of the comparator 230), and the dotted line of the counter value CNT indicates an ideal counter value corresponding to the ideal case of the ramp signal Vramp.

It is noted that the FIG. 2 and FIG. 3 show the operations of the voltage sensor 170 when the RC-calibration enable signal RCCAL_EN does not have the enablement indication, that is the voltage sensor 170 senses the voltage level of one of the signals VT1-VT3, V1 and V2 to generate the sensing result VS_OUT. In addition, if the RC-calibration enable signal RCCAL_EN has the enablement indication, the comparator 230 serves as the comparator 172 shown in FIG. 1, that is the comparator 230 receives the voltage RCCAL_IN from the RC calibration circuit 130 via the multiplexer 160, and compares the voltage RCCAL_IN with the reference voltage VREF to generate the comparison result. In addition, one or more switches may be positioned at the input terminals of the comparator 230 to select the input signals (i.e., select the input signal VI or the voltage RCCAL_IN, and select the ramp signal VRAMP or the reference voltage VREF). In addition, when the RC-calibration enable signal RCCAL_EN has the enablement indication, the comparison result CMP_OUT or the counter value of the counter 250 shown in FIG. 2 serves as the comparison result of the comparator 172 shown in FIG. 1 and is sent back to the control circuit 110 via the level shifting circuit 190.

Figure 4:
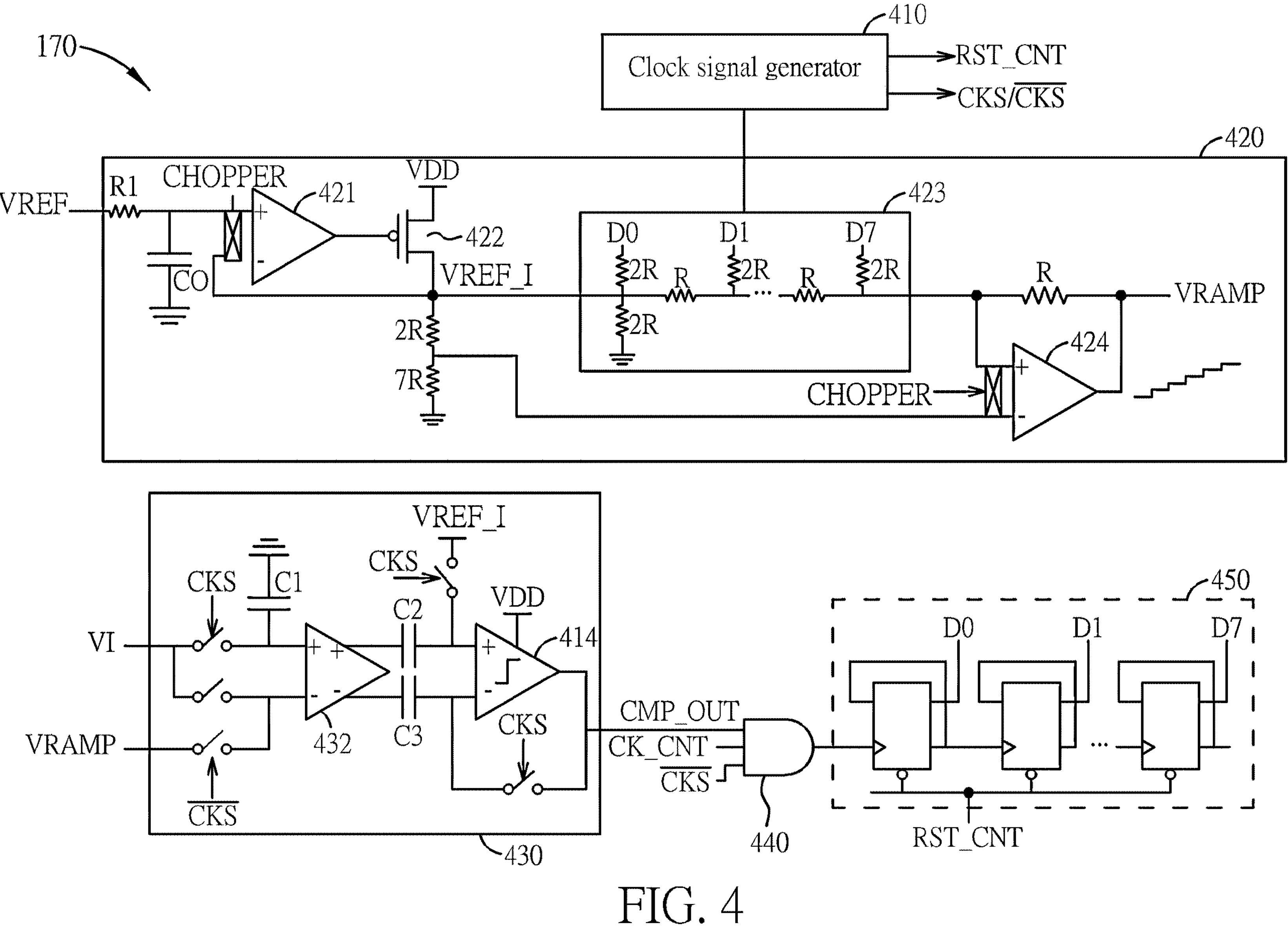
FIG. 4 is a diagram illustrating the voltage sensor according to one embodiment of the present invention.

FIG. 4 diagram illustrating the low-cost and non-calibration voltage sensor 170 according to one embodiment of the present invention. As shown in FIG. 4, the voltage sensor 170 comprises a clock signal generator 410, a ramp signal generator 420, a comparator module 430, a logical gate 440 and a counter 450. The clock signal generator 410 is configured to generate a clock signals to the ramp signal generator 420. The ramp signal generator 420 comprises a resistor R1, a capacitor C0, a reference buffer 421, a P-type transistor 422, a resistor-to-resistor digital-to-analog converter (R2R DAC) 423, and a DAC buffer 424. The comparator module 430 comprises multiple switches, a capacitor C1, a pre-amplifier 432, two capacitors C2 and C3, and a comparator 414.

In the embodiment shown in FIG. 4, the ramp signal generator 420 is configured to generate a ramp signal VRAMP (i.e., voltage signal). The comparator module 430 is configured to compare an input signal VI with the ramp signal VRAMP to generate a comparison result CMP_OUT. The logical gate 440 is implemented by using an AND gate and is configured to receive the comparison result CMP_OUT, the clock signal CKS and a counter clock signal CK_CNT to generate a counter control signal, to trigger the flip-flops within the counter 450 to increase/update the counter value. In addition, every one cycle of the chopper signal CHOPPER, a reset signal RST_CNT is applied to the flip-flops of the counter 250 to reset the counter value CNT.

It is noted that because the main operations and input/output of the ramp signal generator 420 and the comparator module 430 are known, and a person skilled in the art should understand the circuit designs of these elements, the detail circuit structure of the ramp signal generator 420 and the comparator module 430 do not described here. In addition, in the comparator module 430, a clock signal CKSB is an inverted signal of the clock signal CKS, and the symbol "VREF_I" is a reference voltage.

It is noted that the FIG. 4 show the operations of the voltage sensor 170 when the RC-calibration enable signal RCCAL_EN does not have the enablement indication, that is the voltage sensor 170 senses the voltage level of one of the signals VT1-VT3, V1 and V2 to generate the sensing result VS_OUT comprising D0-D7. In addition, if the RC-calibration enable signal RCCAL_EN has the enablement indication, the comparator 430 serves as the comparator 172 shown in FIG. 1, that is the comparator 430 receives the voltage RCCAL_IN from the RC calibration circuit 130 via the multiplexer 160, and compares the voltage RCCAL_IN with the reference voltage to generate the comparison result. In addition, one or more switches may be positioned at the input terminals of the comparator 430 to select the input signals (i.e., select the input signal VI or the voltage RCCAL_IN, and select the ramp signal VRAMP or the reference voltage VREF). In addition, when the RC-calibration enable signal RCCAL_EN has the enablement indication, the comparison result CMP_OUT or the counter value of the counter 450 shown in FIG. 4 serves as the comparison result of the comparator 172 shown in FIG. 1 and is sent back to the control circuit 110 via the level shifting circuit 190.

In addition, the circuit structures of the voltage sensor 170 shown in FIG. 2 and FIG. 4 are for illustrative, not a limitation of the present invention. As long as the comparator of the voltage sensor 170 can be used for RC calibration and voltage sensing at different times, the voltage sensor 170 can have any suitable circuit structure.

The above embodiments are proposed to achieve the absolute voltage measurement without any additional calibration and low-cost purpose. In addition, the two non-ideal effects in the real circuit can be resolved without calibration. The first one is the offset in reference buffer 421 and DAC buffer 424 which result in the gain error of voltage sensor. The second one is the offset error in the comparator 430. The above non-ideal effects can be overcome by following techniques: The positive and negative offset in reference buffer 421 and DAC buffer 424 can be produced with two phases by chopping and further average in digital domain. This technique equipping in SSADC can also save one more set of digital adders because of the continuously counting character. There are more detail operation steps in the timing diagram in FIG. 3. The two slopes S1 and S2 of the ramp signal VRAMP represent the positive and negative offset induced gain error, and the counter value CNT depicts the continuously counting character in SSADC. In addition, the offset error in the comparator 430 can be cancelled by auto-zeroing or output offset storage technique 430. By combining the above two technique, the low-cost and absolute voltage measurement without calibration is accomplished.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A process-voltage (PV) sensor, comprising:

a control circuit, configured to generate at least one control signal;

a resistor-capacitor (RC) calibration circuit, configured to receive the at least one control signal to generate a first voltage that represents (1/(R*C)), where 'R' and 'C' are a resistor and a capacitor within the RC calibration circuit;

a multiplexer, configured to output one of the first voltage generated by the RC calibration circuit and a received signal; and a voltage sensor comprising a comparator, wherein the voltage sensor senses a voltage level of the received signal by using the comparator to generate a sensing result when the multiplexer outputs the received signal, and the comparator is further configured to compare the first voltage with a reference voltage to generate a comparison result to the control circuit when the multiplexer outputs the first voltage.

2. The PV sensor of claim 1, wherein the at least one control signal comprises a RC-calibration enable signal; and when the RC-calibration enable signal has an enablement indication, the comparator of the voltage sensor is configured to compare the first voltage with the reference voltage to generate the comparison result to the control circuit; and when the RC-calibration enable signal does not have the enablement indication, the comparator is configured to generate another comparison result for generating the sensing result according to the received signal.

3. The PV sensor of claim 2, wherein the multiplexer is configured to output the one of the first voltage generated by the RC calibration circuit and the received signal to the voltage sensor according to the RC-calibration enable signal.

4. The PV sensor of claim 1, wherein the voltage sensor comprises an analog-to-digital converter comprising the comparator.

5. The PV sensor of claim 4, wherein the voltage sensor comprises a single-slope analog-to-digital converter (SSADC) comprising the comparator.

6. The PV sensor of claim 5, wherein the voltage sensor comprises:

a ramp signal generator, configured to generate a ramp signal;

the comparator, configured to compare the received signal with the ramp signal to generate another comparison result; and a counter, coupled to the comparator, configured to increase/update a counter value according to the another comparison result, wherein the counter value is used to generate the sensing result of the voltage sensor.

7. The PV sensor of claim 6, wherein the at least one control signal comprises a RC-calibration enable signal; and when the RC-calibration enable signal has an enablement indication, the comparator of the voltage sensor is configured to compare the first voltage with the reference voltage to generate the comparison result to the control circuit; and when the RC-calibration enable signal does not have the enablement indication, the comparator is configured to compare the received signal with the ramp signal to generate the another comparison result.

8. The PV sensor of claim 7, wherein the multiplexer is configured to output one of the first voltage generated by the RC calibration circuit and the received signal to the voltage sensor according to the RC-calibration enable signal.

* * * * *